United States Patent
Tetelbaum et al.

(10) Patent No.: US 6,725,389 B1
(45) Date of Patent: Apr. 20, 2004

(54) METHOD FOR MINIMIZING CLOCK SKEW BY RELOCATING A CLOCK BUFFER UNTIL CLOCK SKEW IS WITHIN A TOLERABLE LIMIT

(75) Inventors: Alexander Tetelbaum, Hayward, CA (US); Rajiv Kapur, Menlo Park, CA (US)

(73) Assignee: LSI Logic Corporation, Milpitas, CA (US)

( * ) Notice: Subject to any disclaimer, the term of this patent is extended or adjusted under 35 U.S.C. 154(b) by 610 days.

(21) Appl. No.: 09/734,539

(22) Filed: Dec. 11, 2000

(51) Int. Cl.[7] .................................................. G06F 1/10
(52) U.S. Cl. ............................ 713/400; 716/6; 713/401
(58) Field of Search .................... 716/11, 6, 2; 714/700; 713/401, 400; 438/129

(56) References Cited

U.S. PATENT DOCUMENTS

| | | | |
|---|---|---|---|
| 5,369,640 A | * 11/1994 | Watson et al. | 714/700 |
| 5,724,557 A | * 3/1998 | McBean, Sr. | 716/6 |
| 5,849,610 A | * 12/1998 | Zhu | 438/129 |
| 6,053,950 A | * 4/2000 | Shinagawa | 716/2 |
| 6,117,183 A | * 9/2000 | Teranishi et al. | 716/11 |
| 6,480,994 B1 | 11/2002 | Tetelbaum et al. | |
| 6,550,045 B1 | 4/2003 | Lu et al. | |

FOREIGN PATENT DOCUMENTS

| | | | | |
|---|---|---|---|---|
| JP | 05054100 A | * | 3/1993 | G06F/15/60 |

OTHER PUBLICATIONS

NN9305307, Clock Distribution Tree for Minimal Clock Skew, May 1, 1993, IBM Technical Disclosure Bulletin, vol. 36, Issue 5, pp. 307–308.*

* cited by examiner

*Primary Examiner*—Thomas Lee
*Assistant Examiner*—Mark Connolly
(74) *Attorney, Agent, or Firm*—Fitch, Even, Tabbin & Flannery

(57) ABSTRACT

A method of clock buffer placement for minimizing clock skew includes the steps of (a) constructing a trunk delay model for a plurality of clock cells within a partitioning group, (b) placing a clock buffer at an initial location in the trunk delay model, (c) estimating a clock skew and an insertion delay from the trunk delay model, (d) checking whether the clock skew exceeds a clock skew limit, and (e) if the clock skew exceeds the clock skew limit, then selecting a new location for the clock buffer in the trunk delay model.

7 Claims, 3 Drawing Sheets

METHOD FOR MINIMIZING CLOCK SKEW BY RELOCATING A CLOCK BUFFER UNTIL CLOCK SKEW IS WITHIN A TOLERABLE LIMIT

BACKGROUND OF THE INVENTION

The present invention relates generally to design tools for integrated circuits. More specifically, but without limitation thereto, the present invention relates to a method for placing clock buffers within a partition of an integrated circuit to minimize clock skew.

Integrated circuits typically include blocks or partitions of multiple circuit elements such as flip-flops, cores, and building block circuits referred to by the equivalent names megacells, hard macros, and "hardmacs". The circuit elements are generally synchronized by a common clock signal from a clock buffer located within each partition. Using current methods for balanced clock placement, the number of clock buffers driven by repeaters is minimized, while downstream delays of each buffer are ignored. Also, ignoring the location of megacells produces groups of circuit elements with large insertion delays. The inability to estimate maximum and minimum delays in groups of circuit elements results in unbalanced partitioning with large clock skew and insertion delay. The unbalanced partitioning requires delay balancing by extra wire insertion, resulting in large errors in delay calculations. A circuit may be partitioned in a single iteration, called one-pass partitioning, or the circuit may be partitioned by an algorithm that examines all cells in several iterations. A partition of a circuit into two parts is called two-way cutting. Two-way cutting may be repeated to further partition a circuit. One-pass partitioning based on two-way cutting does not generally produce good solutions to the problem of balanced clock placement in production designs.

Further, heuristic objective functions used to place clock buffers in groups of circuit elements result in a large clock skew. Heuristic objective functions are quality functions that describe an objective or goal indirectly. An example of a heuristic objective function used to place clock buffers in groups of circuit elements is the minimization of the distance between a buffer location and the center of mass of a group of cells driven by the buffer. The real objective is the minimization of clock skew between the buffer and each cell in the group.

SUMMARY OF THE INVENTION

The present invention advantageously addresses the problems above as well as other problems by providing a balanced clock placement method that minimizes clock skew.

In one embodiment, the present invention may be characterized as a method of clock buffer placement for minimizing clock skew that includes the steps of (a) constructing a trunk delay model for a plurality of clock cells within a partitioning group, (b) placing a clock buffer at an initial location in the trunk delay model, (c) estimating a clock skew and an insertion delay from the trunk delay model, (d) checking whether the clock skew exceeds a clock skew limit, and (e) if the clock skew exceeds the clock skew limit, then selecting a new location for the clock buffer in the trunk delay model.

BRIEF DESCRIPTION OF THE DRAWINGS

The above and other aspects, features and advantages of the present invention will be more apparent from the following more specific description thereof, presented in conjunction with the following drawings wherein.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

Figure 1:
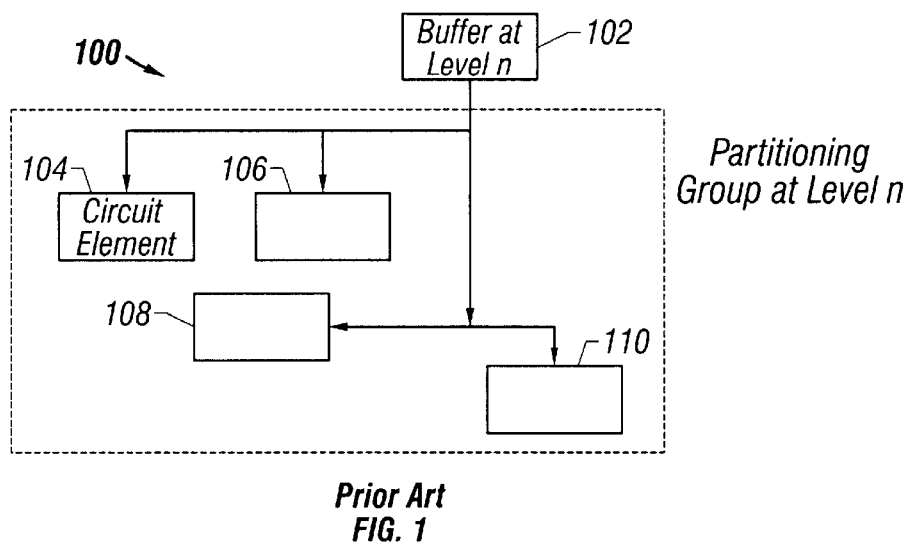
FIG. 1 is a diagram of a partitioning group of the prior art for integrated circuit.

FIG. 1 is a diagram of a partitioning group 100 of the prior art for an integrated circuit. Shown in FIG. 1 are a clock buffer 102 and circuit elements 104, 106, 108, and 110. The circuit elements 104, 106, 108, and 110 may be, for example, flip-flops, cores, and building block circuits called hard macros or "hardmacs".

The clock buffer 102 provides clock pulses to each of the circuit elements 104, 106, 108, and 110 to synchronize their operation. Because the wire lengths from the clock buffer 102 to each of the circuit elements 104, 106, 108, and 110 usually differ, the clock pulses arrive at each of the circuit elements at different times. The differences in propagation delays from the clock buffer 102 to each of the circuit elements 104, 106, 108, and 110 is called clock skew. A clock skew in excess of a maximum skew tolerance could cause the integrated circuit to malfunction. By placing the clock buffer near the middle of the partitioning group 100, clock skew may be reduced.

Figure 2:
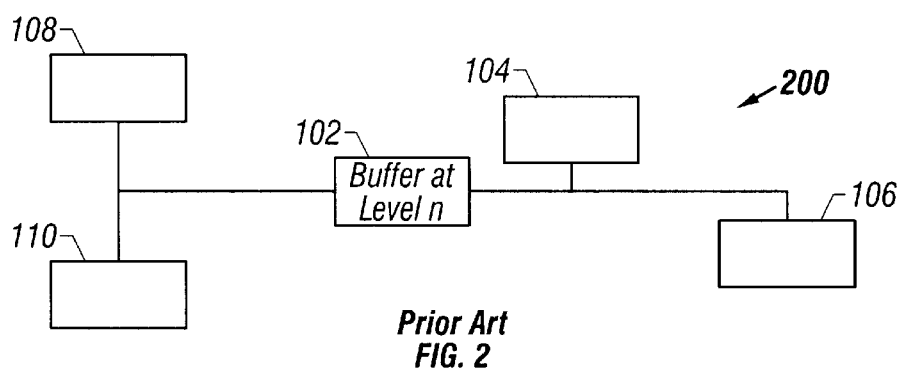
FIG. 2 is a diagram of a conventional clock buffer placement scheme for the partitioning group FIG. 1.

FIG. 2 is a diagram of a conventional clock buffer placement scheme 200 for the partitioning group 100 of FIG. 1. Shown in FIG. 2 are the clock buffer 102 and the circuit elements 104, 106, 108, and 110. In this example, the clock buffer 102 is placed close to the center of mass of the circuit elements 104, 106, 108, and 10. As a result, the delay between the clock buffer 102 and the circuit element 104 is much less than the delays between the clock buffer 102 and the other circuit elements 106, 108, and 110. The difference in delays results in a large clock skew.

Figure 3:
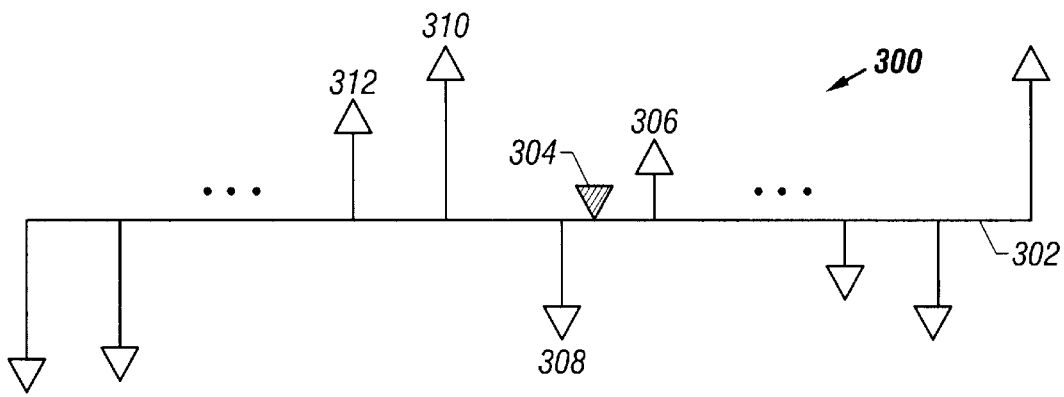
FIG. 3 is a diagram of a trunk delay model for the partitioning of FIG. 1.

FIG. 3 is a diagram of a trunk delay model 300 for the partitioning group 100 of FIG. 1. Shown in FIG. 3 are a trunk 302, a location 304 of the clock buffer 102, and locations 306, 308, 310, and 312 of the circuit elements 104, 106, 108, and 110, respectively. The trunk delay model 300 maps the circuit elements 104, 106, 108, and 110 in a convenient line or trunk according to well known techniques that simplifies the calculation of delays. Using the trunk delay model 300, an initial location is selected for the location 304 of the clock buffer 102 and the clock skew and insertion delay are calculated. The insertion delay is the maximum of the delays between the clock buffer 102 and each of the circuit elements 104, 106, 108, and 110.

Figure 4:
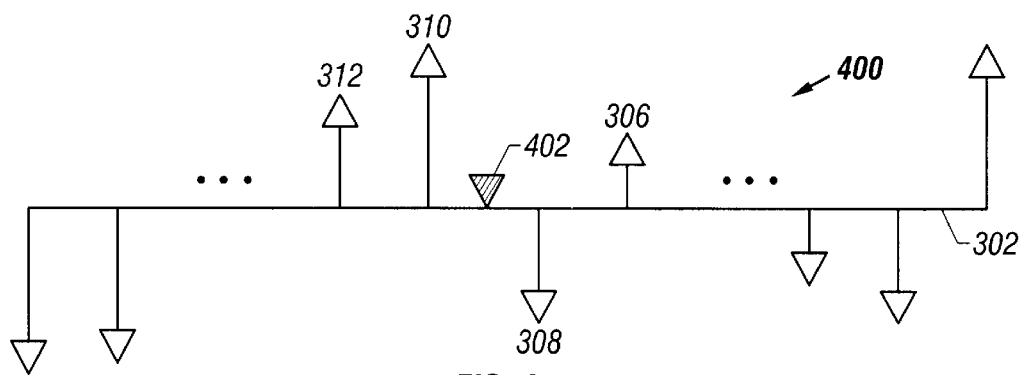
FIG. 4 is a diagram of the trunk delay model of FIG. 3 illustrating a clock buffer placement scheme to minimize clock skew according to an embodiment of the present invention.

FIG. 4 is a diagram of the trunk delay model of FIG. 3 illustrating a clock buffer placement scheme 400 to minimize clock skew. Shown in FIG. 4 are the trunk 302, a location 402 of the clock buffer 102, and locations 306, 308, 310, and 312 of the circuit elements 104, 106, 108, and 110, respectively. If the clock skew calculated from the location 402 of the clock buffer 102 exceeds a maximum clock skew tolerance, the location 402 of the clock buffer 102 is moved until the clock skew reaches a minimum at an optimum position, and the insertion delay is recalculated for the optimum position.

Figure 5:
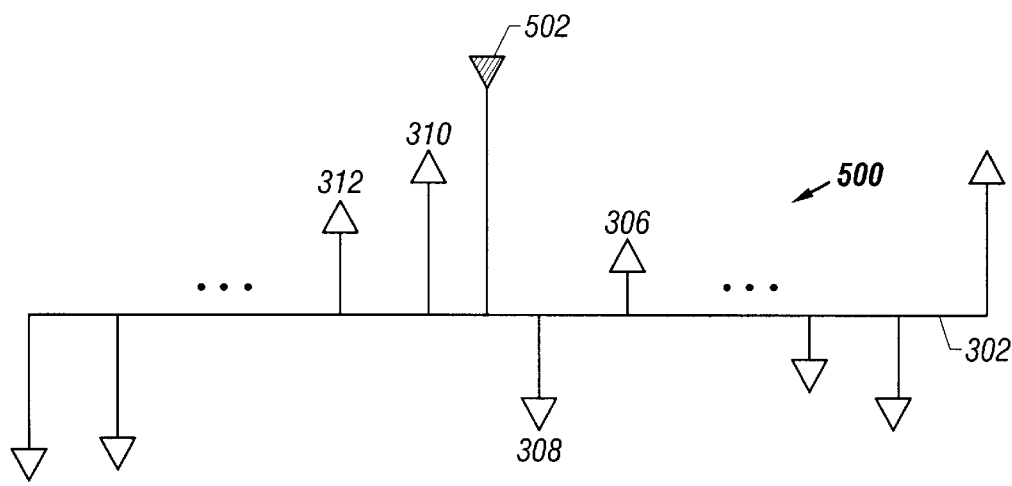
FIG. 5 is a diagram of the trunk delay model of FIG. 4 illustrating a clock buffer placement scheme to balance insertion delay according to another embodiment of the present invention.

FIG. 5 is a diagram of the trunk delay model of FIG. 4 illustrating a clock buffer placement scheme 500 to balance insertion delay. Shown in FIG. 5 are the trunk 302, a new clock position 502 of the clock buffer 102, and locations 306, 308, 310, and 312 of the circuit elements 104, 106, 108, and 110, respectively. After the clock buffer location is found that minimizes clock skew, the insertion delay is compared to an average insertion delay of the other partitioning groups included in the integrated circuit. If the insertion delay is less than the average insertion delay by a minimum insertion delay tolerance, a distance apart from the trunk 302 corresponding to a wire length is calculated to increase the insertion delay to equal the average insertion delay. The clock buffer 102 is then placed at a final position at the calculated distance from the trunk 302.

Figure 6:
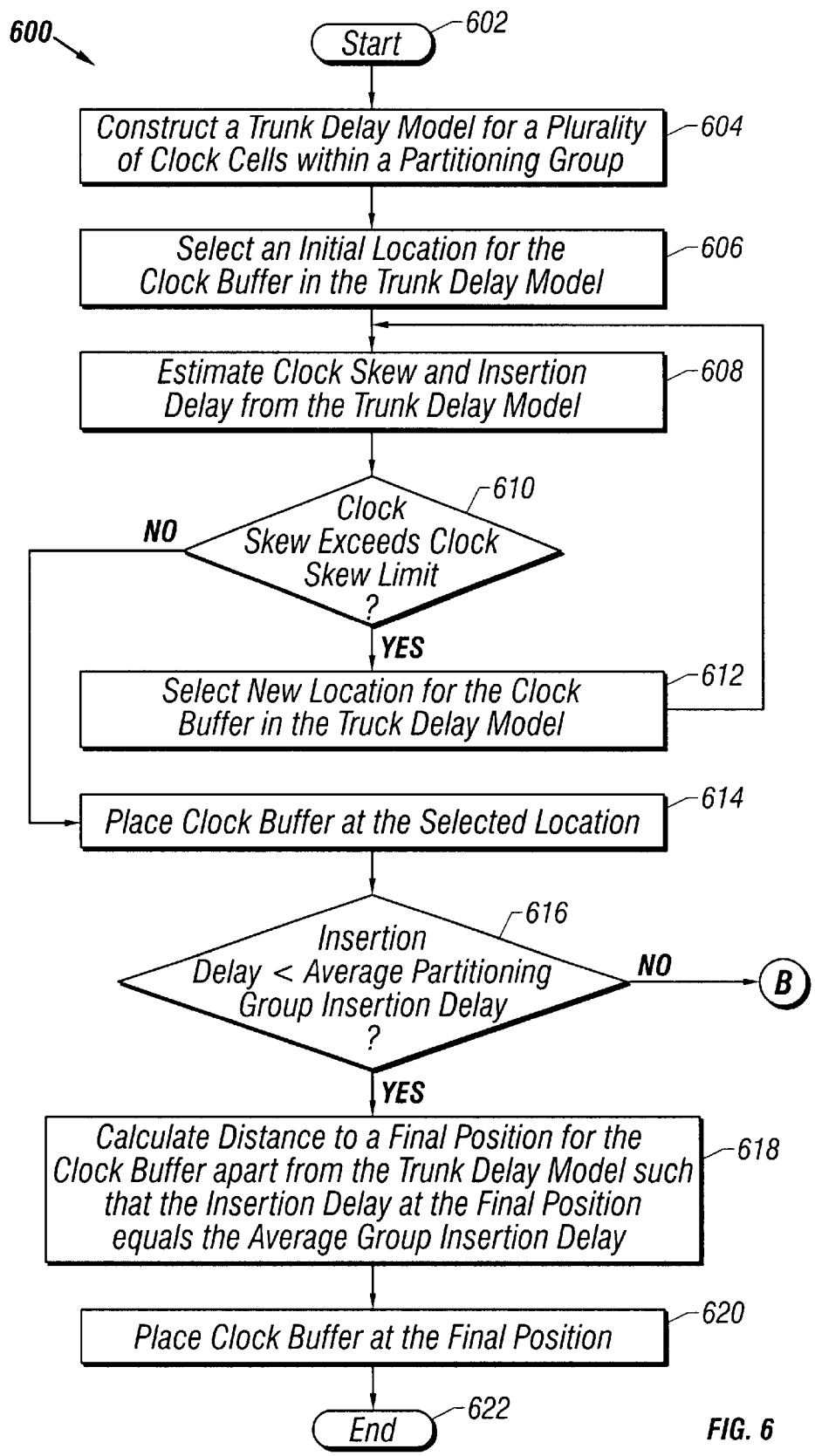
FIG. 6 is a flowchart of a method for the clock buffer placement scheme illustrated in FIGS. 4 and 5.

FIG. 6 is a flowchart 600 of a method for the clock buffer placement scheme illustrated in FIGS. 4 and 5. Step 602 is the entry point for the flowchart 600. Step 604 constructs a trunk delay model for a plurality of clock cells within a partitioning group. Step 606 selects an initial location for the clock buffer in the trunk delay model. Step 608 estimates a clock skew and an insertion delay from the trunk delay model. Step 610 checks whether the clock skew exceeds a clock skew limit. If yes, then step 612 selects a new location for the clock buffer in the trunk delay model and transfers control to step 608. Step 614 places the clock buffer at the selected location. Step 616 checks whether the insertion delay is less than an average partitioning group insertion delay by a minimum insertion delay tolerance. If yes, then step 618 calculates a distance to a final position for the clock buffer apart from the trunk delay model such that the insertion delay at the final position equals the average group insertion delay. Step 620 places the clock buffer at the final position. Step 622 is the exit point for the flowchart 600.

By the method described above, clock skew may be minimized within each partition of an integrated circuit, and insertion delay may be equalized to an average insertion delay to synchronize the operation of every partition of the integrated circuit.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of clock buffer placement for minimizing clock skew comprising the steps of:
   (a) constructing a trunk delay model for a plurality of clock cells within a partitioning group;
   (b) placing a clock buffer at an initial location in the trunk delay model;
   (c) estimating a clock skew and an insertion delay from the trunk delay model;
   (d) checking whether the clock skew exceeds a clock skew limit; and
   (e) if the clock skew exceeds the clock skew limit, then selecting a new location for the clock buffer in the trunk delay model.

2. The method of claim 1 wherein the insertion delay is the maximum of delays between the clock buffer and each of the plurality of clock cells.

3. The method of claim 1 further comprising after step (e) the step of (f) repeating steps (c), (d), and (e) until the clock skew is minimized.

4. The method of claim 3 further comprising after step (f) the step of (g) placing the clock buffer at the new location wherein the clock skew is minimized.

5. The method of claim 4 further comprising after step (g) the step of (h) checking whether the insertion delay is less than an average partitioning group insertion delay.

6. The method of claim 5 further comprising after step (h) the step of (i) if the insertion delay is less than the average partitioning group insertion delay, then calculating a distance to a final position for the clock buffer apart from the trunk delay model such that the insertion delay at the final position equals the average group insertion delay.

7. The method of claim 6 further comprising after step (i) the step of (j) placing the clock buffer at the final position.

* * * * *